(12) United States Patent
Baker et al.

(10) Patent No.: US 7,873,857 B2
(45) Date of Patent: Jan. 18, 2011

(54) MULTI-COMPONENT MODULE FLY-BY OUTPUT ALIGNMENT ARRANGEMENT AND METHOD

(75) Inventors: Ronald Baker, Raleigh, NC (US); George Alexander, Durham, NC (US)

(73) Assignee: Qimonda AG, Munich (DE)

( * ) Notice: Subject to any disclaimer, the term of this patent is extended or adjusted under 35 U.S.C. 154(b) by 885 days.

(21) Appl. No.: 11/624,465

(22) Filed: Jan. 18, 2007

(65) Prior Publication Data
US 2008/0177911 A1 Jul. 24, 2008

(51) Int. Cl.
G06F 1/12 (2006.01)
G06F 13/42 (2006.01)
H04L 5/00 (2006.01)
H04L 7/00 (2006.01)

(52) U.S. Cl. .................. 713/401; 713/400; 713/500; 713/501; 713/502; 713/503; 713/600; 713/601; 711/100

(58) Field of Classification Search .............. 713/400, 713/401, 500–503, 600–601; 711/100
See application file for complete search history.

(56) References Cited

U.S. PATENT DOCUMENTS

| | | | | |
|---|---|---|---|---|
| 6,078,976 A * | 6/2000 | Obayashi | .................. | 710/315 |
| 6,259,387 B1 * | 7/2001 | Fukazawa | .................. | 341/100 |
| 7,275,173 B2 | 9/2007 | Lindt | | |
| 7,289,378 B2 | 10/2007 | Ivanov | | |
| 2005/0005184 A1 | 1/2005 | Lindt | | |
| 2005/0010741 A1 | 1/2005 | Lee et al. | | |
| 2005/0063674 A1 * | 3/2005 | Bilinski et al. | ................. | 386/94 |
| 2005/0219919 A1 | 10/2005 | Ivanov | | |
| 2006/0253721 A1 * | 11/2006 | Johnson | ..................... | 713/401 |

FOREIGN PATENT DOCUMENTS

DE 102004014450 A1 2/2005
DE 102004015868 A1 10/2005

OTHER PUBLICATIONS

DDR Registered Modules, simmtester.com, Apr. 1, 2003, CST Publications, Copyright 2003 CST, Inc.

* cited by examiner

Primary Examiner—Abdelmoniem Elamin
(74) Attorney, Agent, or Firm—Edell, Shapiro & Finnan, LLC

(57) ABSTRACT

A method and multi-component electronic module device are provided that control the timing of output of data from a plurality of components on the multi-component module. One or more of the components are programmed to delay outputting data by a corresponding amount of time. In one embodiment, the one or more components are programmed such that all of the components output data at substantially the same time when they respond to a control signal. This is particularly useful for multi-component modules that are configured to respond to control signals in a so-called fly-by (or other) configuration that results in the control signal arriving at the components at different times causing the components to react to the control signal at different times.

12 Claims, 8 Drawing Sheets

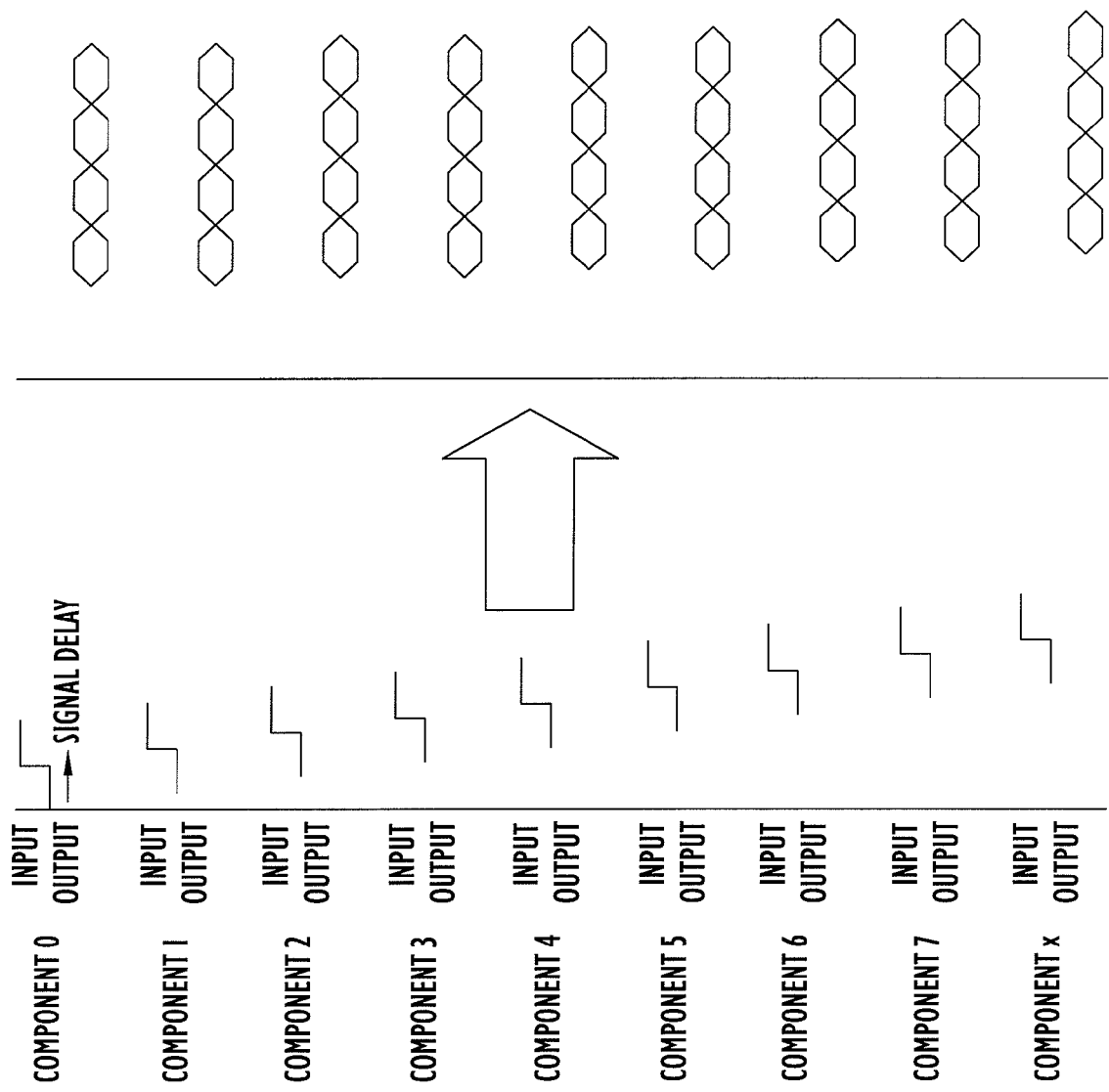

MULTI-COMPONENT MODULE FLY-BY OUTPUT ALIGNMENT ARRANGEMENT AND METHOD

BACKGROUND OF THE INVENTION

In the electronics industry, it is common to mount several similar function integrated circuit devices onto a common circuit board to form what is known in the industry as a multi-component module. For example, multiple semiconductor integrated circuit memory devices or components are mounted to a common circuit board to form a memory module. The memory module is connected to a main circuit board to interact with other components in a system, e.g., in a computer system. The components on the memory module are read and written to in cooperation with each other. A controller controls access to the components on the module.

In the past, components on the module circuit board would be laid out to compensate for the time delay of signals to and from the components. However, as semiconductor fabrication technologies and circuit designs have advanced, the components have become so fast that it is not necessary to account for signal propagation delays order to synchronize signals to and from the components. As an example, next generation memory modules made according to the DDR3 (and later) standard use what is known as "fly by" connections for inputs of control signals to the components on the module. Fly-by connections are laid out such that connections made between the controller and the components take the shortest path possible, and the controller supplies control signals with each component sequentially. However, each component has dedicated outputs that are connected in parallel to the controller. The control signals will arrive at components that are closer to the controller earlier than at components that are further down the line. Consequently, each component will react to the control signal from the controller at a slightly different (later) time and therefore react to the control slightly later such that the outputs from the components will not be time aligned. This misalignment of the output from the components makes processing of the data at the controller complicated and also makes design of tester devices for testing the multi-component modules more complex.

SUMMARY OF THE INVENTION

Briefly, a method and multi-component electronic module device are provided that control the timing of output of data from a plurality of components on the multi-component module. One or more of the components are programmed to delay outputting data by a corresponding amount of time. In one embodiment, the one or more components are programmed such that all of the components output data at substantially the same time when they respond to a control signal. This is particularly useful for multi-component modules that are configured to respond to control signals in a so-called fly-by (or other) configuration that results in the control signal arriving at the components at different times causing the components to react to the control signal at different times.

In applications where the components have a clock processing circuit, such as a delay lock loop (DLL) circuit, that controls the timing of component operations with respect to an input clock signal, the timing skew of the clock processing circuit is programmed to a value that is determined to achieve desired timing offsets (i.e., no timing offset) of data output from the plurality of components. In an embodiment in which the components are semiconductor integrated circuit memory devices, the programming command supplied to the components may originate from a memory controller at power-up, or from a tester device that is connected to the module at the beginning of a testing procedure. In order to program the delay in the components, a control signal is sent to the components that provokes them to output data. The output data is received at the controller or tester device, and the timing offsets of the data among the plurality of memory components are determined. Based on the measured timing offsets, the controller or tester device computes values for timing skews to be programmed into one or more of the components to achieve the desired timing of data output from the components.

BRIEF DESCRIPTION OF THE DRAWINGS

FIG. 8 is a timing diagram showing alignment of the output data from the individual components according to an embodiment of the invention.

DETAILED DESCRIPTION

According to one embodiment, the present invention involves a method to control the timing of output of data from a plurality of components of a multi-component module. Each component is programmed to delay outputting its data by a corresponding amount of time. In one application, the components are programmed by a device external to the multi-component module, such as by an external controller or a tester device. The amount of delay programmed into each component may be selected such that all of the components output data in response to a command or control signal at substantially the same time. The amount of delay programmed into the respective components is set to compensate for the fact that the components further down the line on the module will receive and thus react later to the command or control signal from a controller. For example, the components furthest down the line may be programmed with zero delay, whereas the amount of delay programmed into the components moving progressively closer to the controller will be programmed with progressively larger delay amounts so that all of the components output data at substantially the same time.

Using these techniques, the controller that controls the components on the module can be simplified because it no longer needs to be designed to expect output data from the components at different times. Furthermore, the complexity of tester devices used to test the components on the module can be simplified as well. Tester devices are not designed to expect data at different times. As a result, the tester device has to be designed to use strobes to identify where to look for data. There are a limited number of strobes resources on a test device. By allowing for external programming of the timing skew of each component, the tester device can test each component on the module without employing additional strobe resources.

Figure 1:
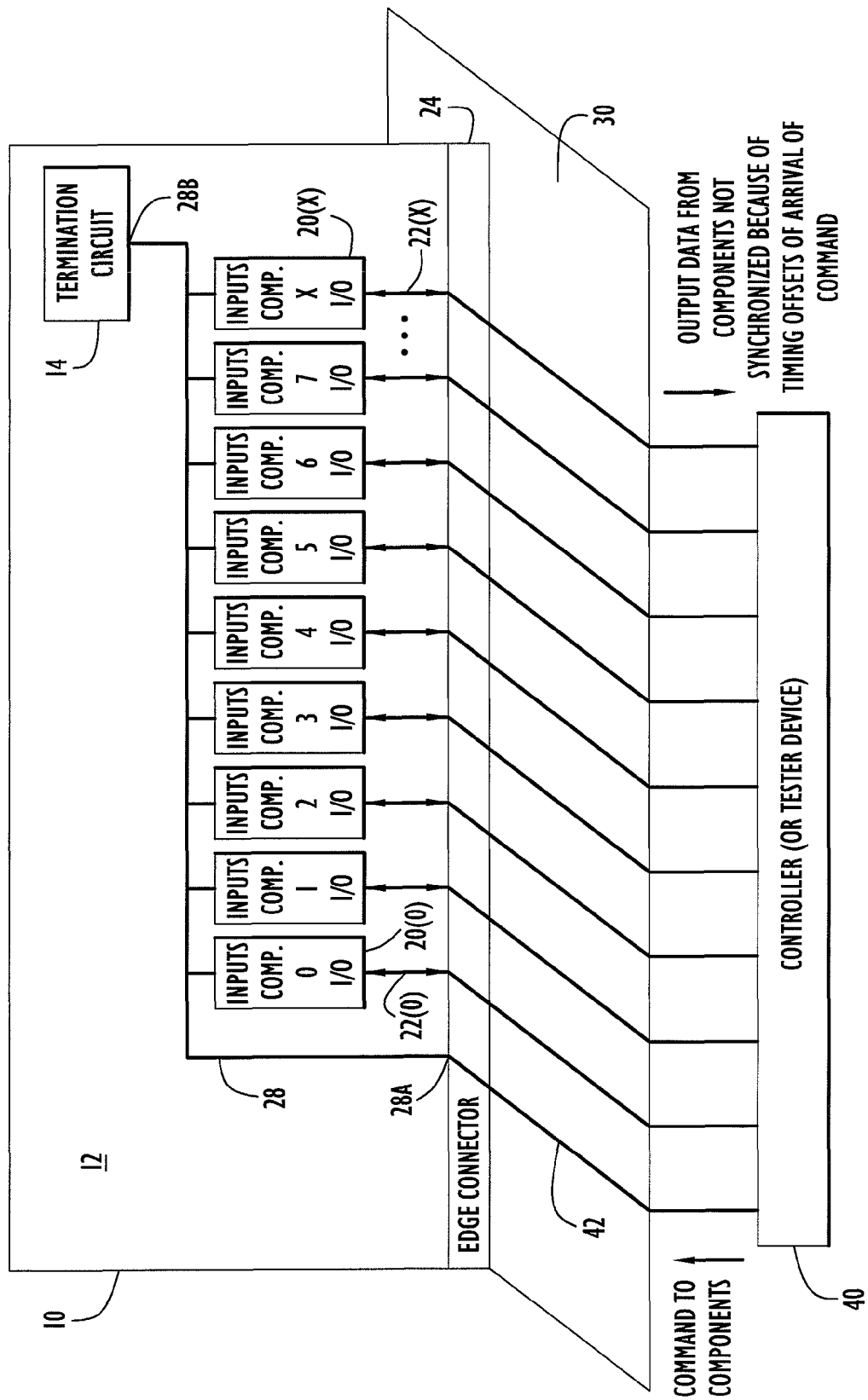
FIG. 1 is a block diagram showing a conventional multi-component module.

Referring first to FIG. 1, a prior art multi-component module is shown at reference numeral 10. There are a plurality of components 20(0) to 20(x) mounted on the circuit board 12 of the module. In one example, the module 10 is a DDR3 (or later generation) memory module and the components are identical semiconductor integrated circuit (IC) memory devices. In general, the components 20(0) to 20(x) may be similar function devices, but there may be applications where the components are not all identical similar function devices. The module 10 comprises an edge connector 24 that connects the module 10 to a circuit board 30. A controller 40 is provided on, or connected to, the circuit board 30. The controller 40 supplies commands or control signals to the components 20(0) to 20(x) in a "fly by" configuration as shown in the figure. That is, there is a control bus 28 on the module 10 that at a first end 28A proximate the edge connector 24 connects to, and receives commands from, a bus 42 on the main circuit board 30. The bus 28 connects to each of the components 20(0) and 20(x) in a sequential manner between the first end 28A and a second end 28B that is connected to a termination circuit 14. Consequently, the components 20(0), 20(1), 20(2) closer to the first end 28A receive the commands from the controller 40 earlier in time than the components 20(3), 20(4), . . . , 20(x) further down the line. However, the components output data on dedicated input/output buses 22(0) to 22(x), respectively, to the edge connector 124. The number of components on the module 10 may vary, hence use of the term "x" in denotes any number of components may be deployed on the module 10.

Figure 2:
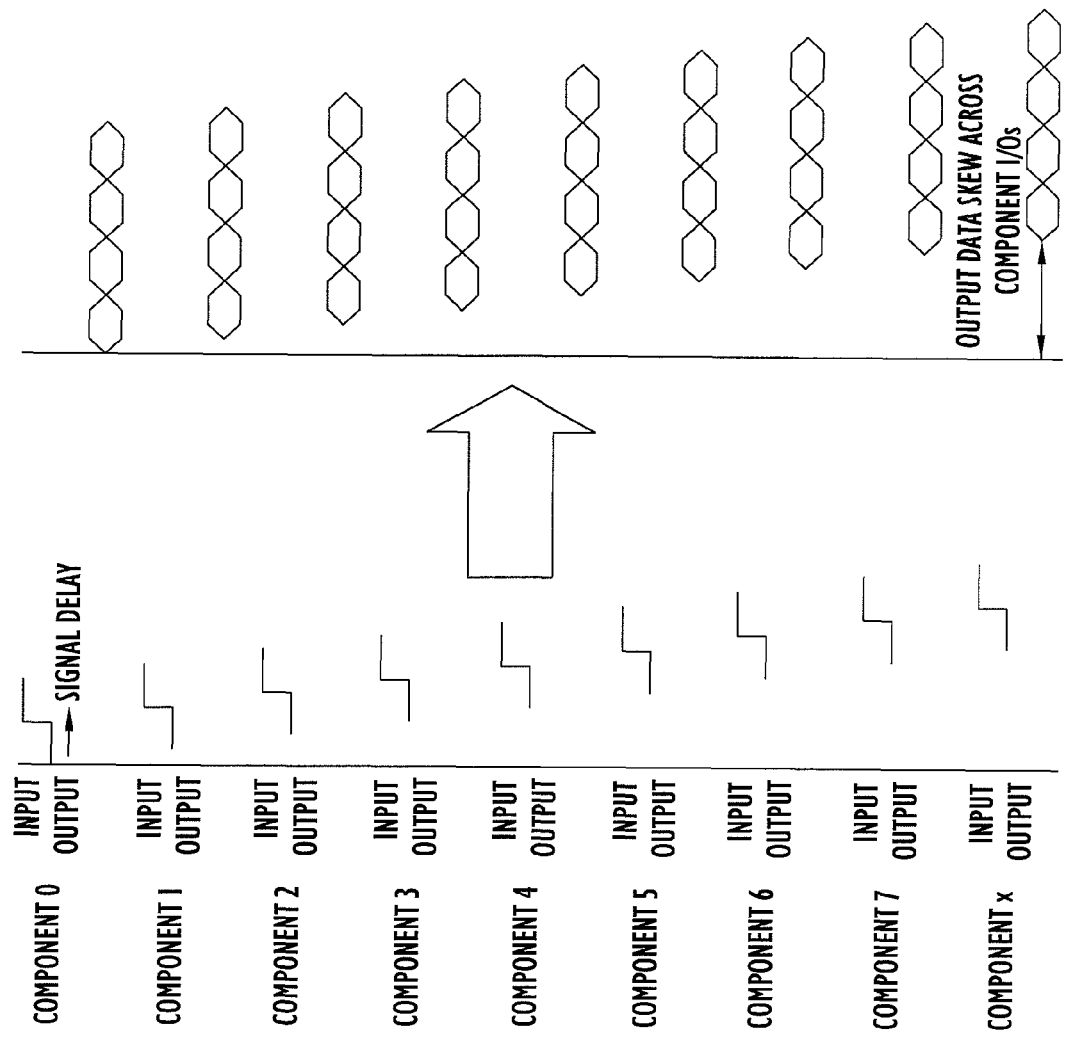
FIG. 2 is a timing diagram showing operation of the conventional multi-component module shown in FIG. 1.

Turning to FIG. 2, the timing of input of a command and output of data in response to the command for each component 20(0) to 20(x) is shown in FIG. 2. Specifically, component 20(0) receives the command first in time and consequently reacts to it first to output data. Components 20(1) to 20(x) respond to the command progressively later in time and thus output data in response to the command progressively later in time. The controller 40 will see output data from the components at progressively later times.

Figure 3:
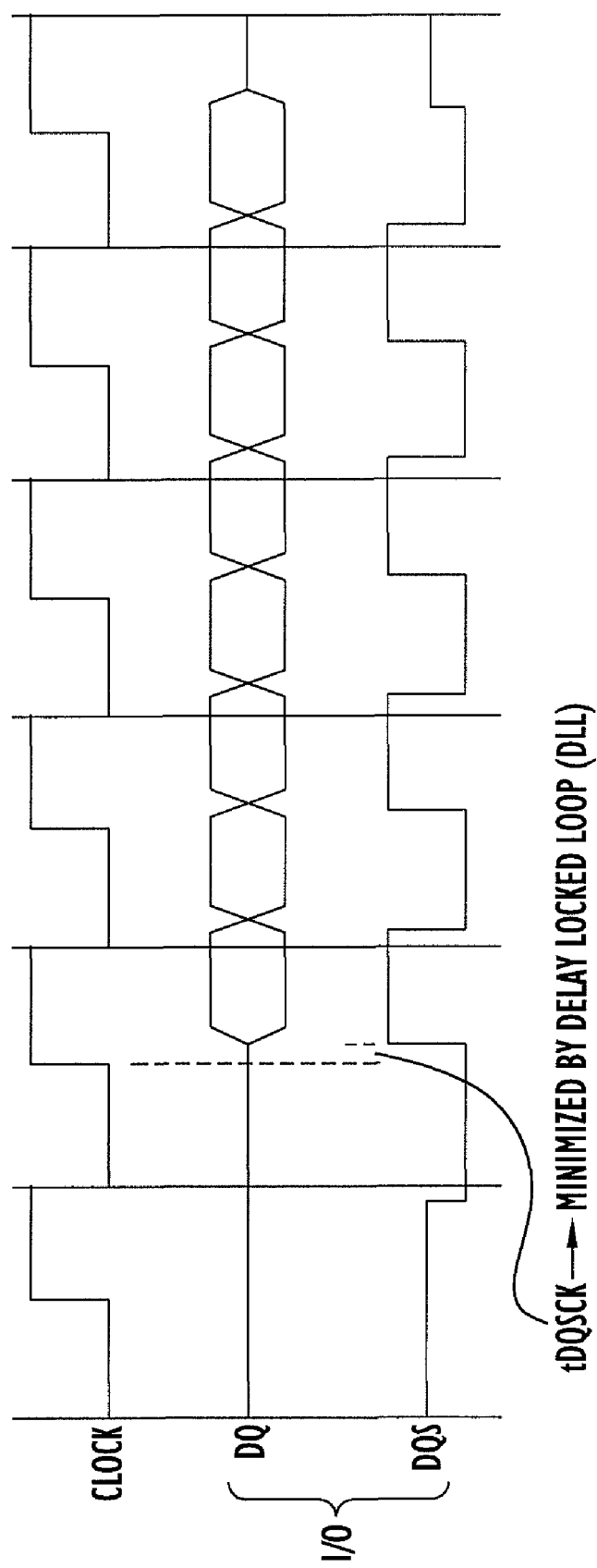
FIG. 3 is a timing diagram depicting operation of a conventional DLL circuit in components of the prior art multi-component module.

FIG. 3 illustrates a timing diagram depicting operation of a DLL circuit that is common in various IC components, such as memory devices. The DLL circuit receives as input an externally supplied clock signal and is normally designed to align DQ and DQS data output with the external clock signal, where tDQSCK is the offset between the clock and the DQ and DQS data outputs. Normally, the DLL circuit is designed to minimize tDQSCK (to zero). However, according to one aspect of the present invention, the timing skew or delay tDQSCK of the DLL circuit in each component is programmed to a value or amount determined to achieve a desired relationship with respect to the data output by all of the components.

Figure 4:
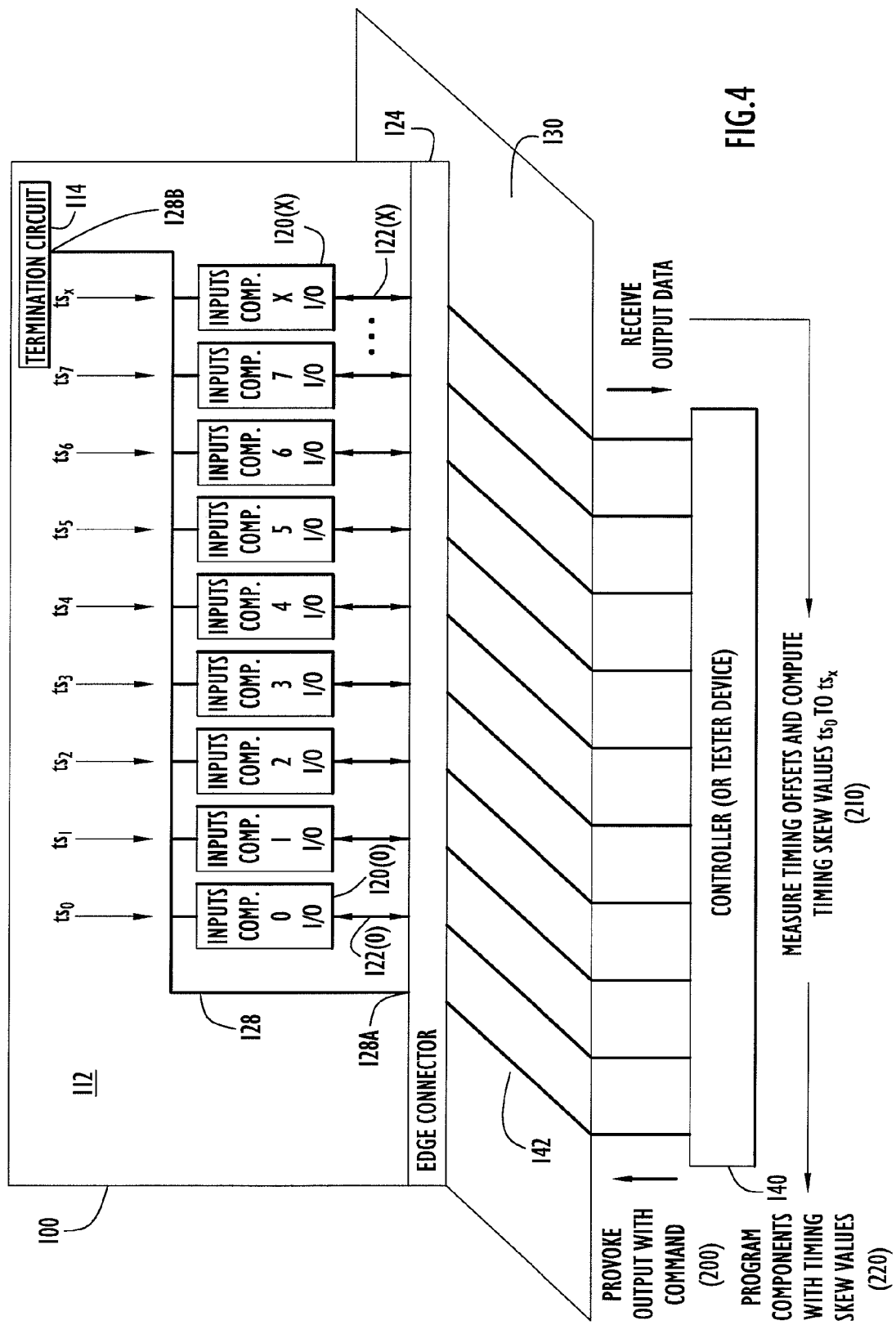
FIG. 4 is a block diagram showing a multi-component module according to one embodiment of the invention.

FIG. 4 illustrates a multi-component module according to one embodiment of the invention. The module is shown at reference numeral 100 and comprises a plurality of components 120(0) to 120(x) mounted on a circuit board 112. The module 100 comprises an edge connector 124 that connects the module 100 to a main circuit board 120. A control or command bus 128 is provided that connects to the components 120(0) to 120(x) in a "fly-by" configuration. The bus 128 comprises a first end 128A at the edge connector 124 and a second end that connects to a termination circuit 114. Along the length of the bus 128 between its first and second ends, there is a connection to each component 120(0) to 120(x) in a "fly-by" configuration. A controller 140 on or connected to the main circuit board 130 controls the components on the module 100. Alternatively, reference numeral 140 may correspond to a tester device that supplies test commands to the module 100 and analyzes responsive output data to test the operation of the components 120(0) to 120(x) on the module. For simplicity, the following description uses the term controller but it should be understood that that the methodology described herein is equally applicable when a tester device is used as described hereinafter. The controller 140 sends commands to the module 100 by way of a bus 142 on the main circuit board 130 that connects to the control bus 128 on the module 100 via the edge connector 124. Each of the components 120(0) to 120(x) outputs data on a dedicated one of input/output bus 122(0) to 122(x), respectively, to the edge connector 124.

The controller 140 configures the memory components so as to control the alignment of the output of data from the memory components. One application for this technique as indicated above is to program the components 120(0) to 120(x) so that they output data at substantially the same time in response to a command from the controller 140. However, it should be understood that there may be other uses of these techniques where the timing of the components 120(0) to 120(x) is programmed to output data in some other timing relationship that is not necessarily at the same time. The controller or 140 programs a circuit, such as a DLL circuit, in each of the components 120(0) to 120(x) so as to intentionally introduce a timing skew in the components in order to achieve the output timing desired.

Figure 5:
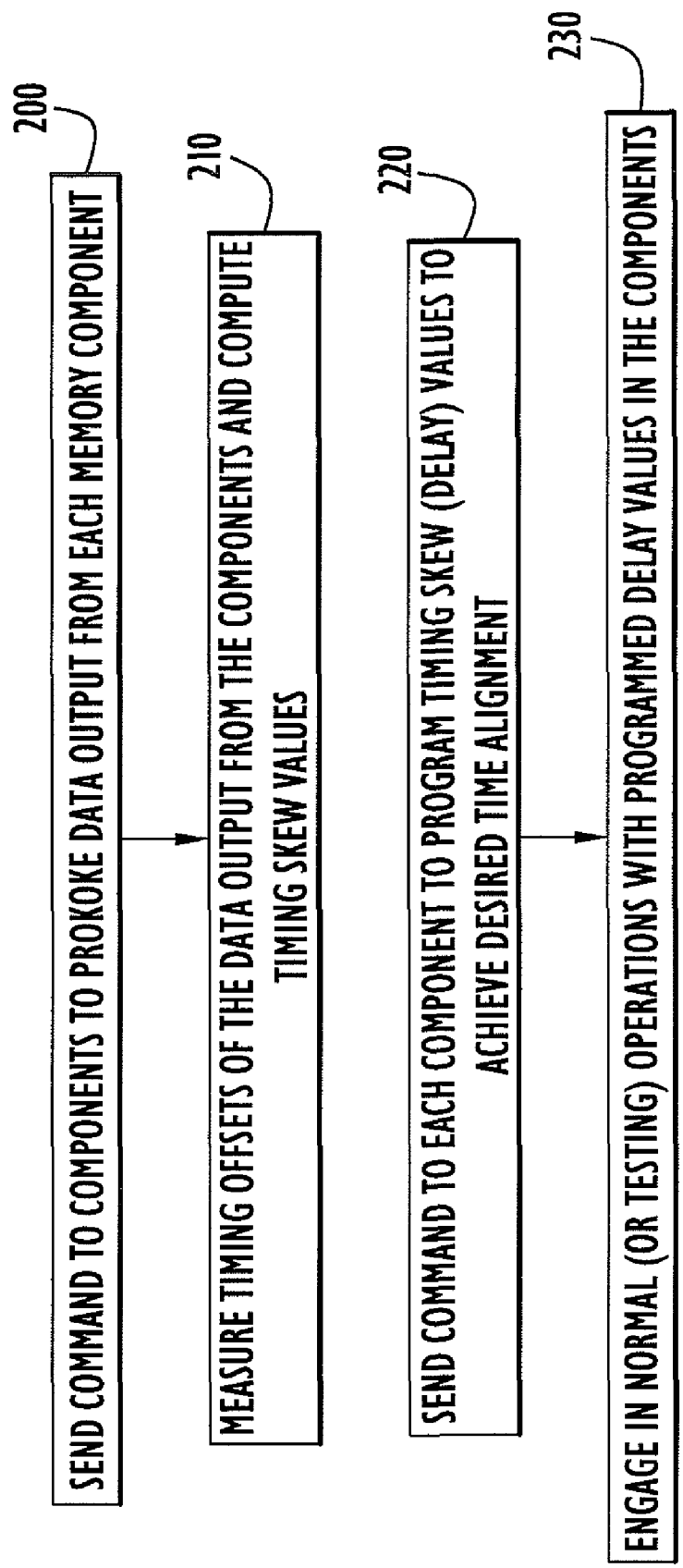
FIG. 5 is a flow chart showing a method for configuring the multi-component module according to an embodiment of the invention.

Turning to FIG. 5, with continued reference to FIG. 4, the process of programming the components 120(0) to 120(x) is as follows. At 200, the controller 140 sends a command down control bus 128 that provokes the components to output data at their dedicated input/output buses to the edge connector 124. For example, the command may be a Read command in the case of memory components on the module 100. The command is received by each of the components 120(0) to 120(x), but the components closer to the controller or tester device 140 will receive (and therefore react to) the command earlier than the components further from the controller or tester device 140. The controller 140 receives the output data from each of the components 120(0) to 120(x) via their dedicated input/output buses 122(0) to 122(x).

Next, at 210, the controller 140 measures the timing offsets of the output data from the received via the edge connector 124 from components 120(0) to 120(x). These timing offsets indicate the amount of delay experienced by the components with respect to arrival of a command from the controller 140. Using the measured timing offsets, at 220 the controller 140 computes timing skew values $ts_0, ts_1, \ldots, ts_x$, for components 120(0) to 120(x), respectively, to control the timing offset of output data from the components. In one embodiment, the controller 140 computes the timing skew values $ts_0, ts_1, \ldots, ts_x$ in order to cause the components to output data at substantially the same time in response to a command or commands from the controller 140. Then, at 230 the controller 140 sends commands to the components 120(0) to 120(x) that program the timing skew values into the respective components. Thereafter, normal module operations or test modes may proceed using the programmed delay values in the components 120(0) to 120(x) as shown at 230. The timing skew information may be measured and programmed timing skew by the controller each time the memory module is powered up, or at the beginning of a functional test mode under commands from a tester device. In one embodiment, the programmed timing skew values are selected in order to intentionally introduce skew for selected components so that all of the components will react to a command and output data at substantially the same time.

Figure 6:
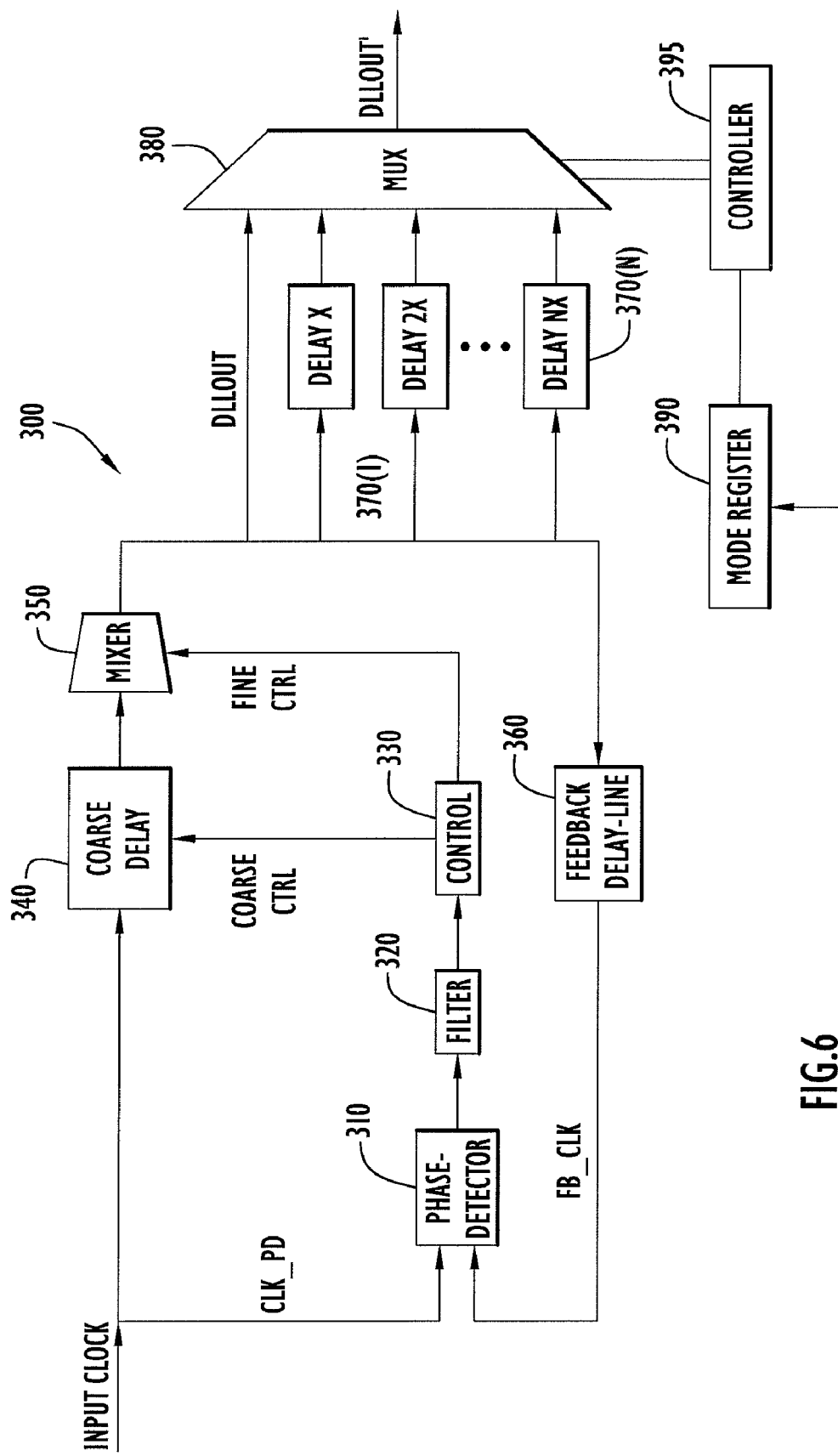
FIG. 6 is a block diagram of a DLL circuit and a programmable circuit for adjusting the timing skew of the DLL circuit according to an embodiment of the invention.

With reference to FIG. 6, in each component 120(0) to 120(x), there is a clock processing circuit, a DLL circuit 300, that controls the timing of operations of the component. The DLL circuit 300 is a common component used in semiconductor IC memory devices. The DLL circuit 300 receives as input an externally supplied clock signal, such as from the module controller. Normally, the DLL circuit 300 is operated to minimize timing skew between an edge of the clock signal and data input/output transitions. However, in accordance with the present invention, the skew is programmed by the controller to achieve a desired timing offset. The DLL circuit 300 is only one example of a clock processing circuit that receives as input an externally supplied clock signal, such as from a controller 140 (FIG. 4), and produces an output signal that is used to control timing of operations and output of data in a component. Other types of timing circuits may exist in the components and be programmed as described herein.

DLL circuits are well known in the art and therefore will only be briefly described herein. The DLL circuit 300 comprises a phase detector 310, a filter 320, a controller 330, a coarse delay element 340, a mixer 350 and a feedback delay-line 360. The phase detector 210 measures phase offset between the input clock signal and a feedback clock signal output by the feedback delay-line 360. The filter 320 filters the output of the phase detector 310. The controller 330 outputs a coarse control (CTRL) signal and a fine CTRL signal to the coarse delay element 340 and mixer 330, respectively. The input to the feedback delay-line 360 essentially constitutes the output of the DLL circuit, DLLout. The controller 330 normally generates the coarse CTRL and fine CTRL signals to minimize timing skew between the input clock signal edge and outputs (or inputs) of the component.

One technique for adjustably/programmably changing the timing skew between input clock signal DLL output signal DLLout is to provide a plurality of delay elements 370(1) to 370(N) that are capable of introducing a time delay ranging from x to Nx (microsecs or milliseconds), for example. The DLLout signal is connected to the input of each of the delay elements 370(1) to 370(N). The output of the DLL circuit 300 and the outputs of each of the delay elements 370(1) to 370(N) are connected to respective inputs of a multiplexer 380. The multiplexer 380 selects for output as the adjusted timing signal DLLout' one of its inputs corresponding to one of outputs of the delay elements 370(1) to 370(N) or the DLLout signal itself (not delayed). Thus, the multiplexer 380 outputs one of DLLout, DLLout(t−x), DLLout(t−2x), DLLout(t−3x), . . . , DLLout(t−Nx). The control information that determines which of the inputs the multiplexer 380 selects for output may be stored in a register, such as a mode register 390. When the controller 140 (FIG. 4) sends a programming command to a component, the programming command writes a value to the mode register 390 that a component controller 395 reads and configures the multiplexer 380 as to which input to select for output as the signal DLLout'. As a result, the amount of delay or timing skew imposed on the output of the DLL circuit 300 is programmable by an external (to the module 100) programming command.

Figure 7:
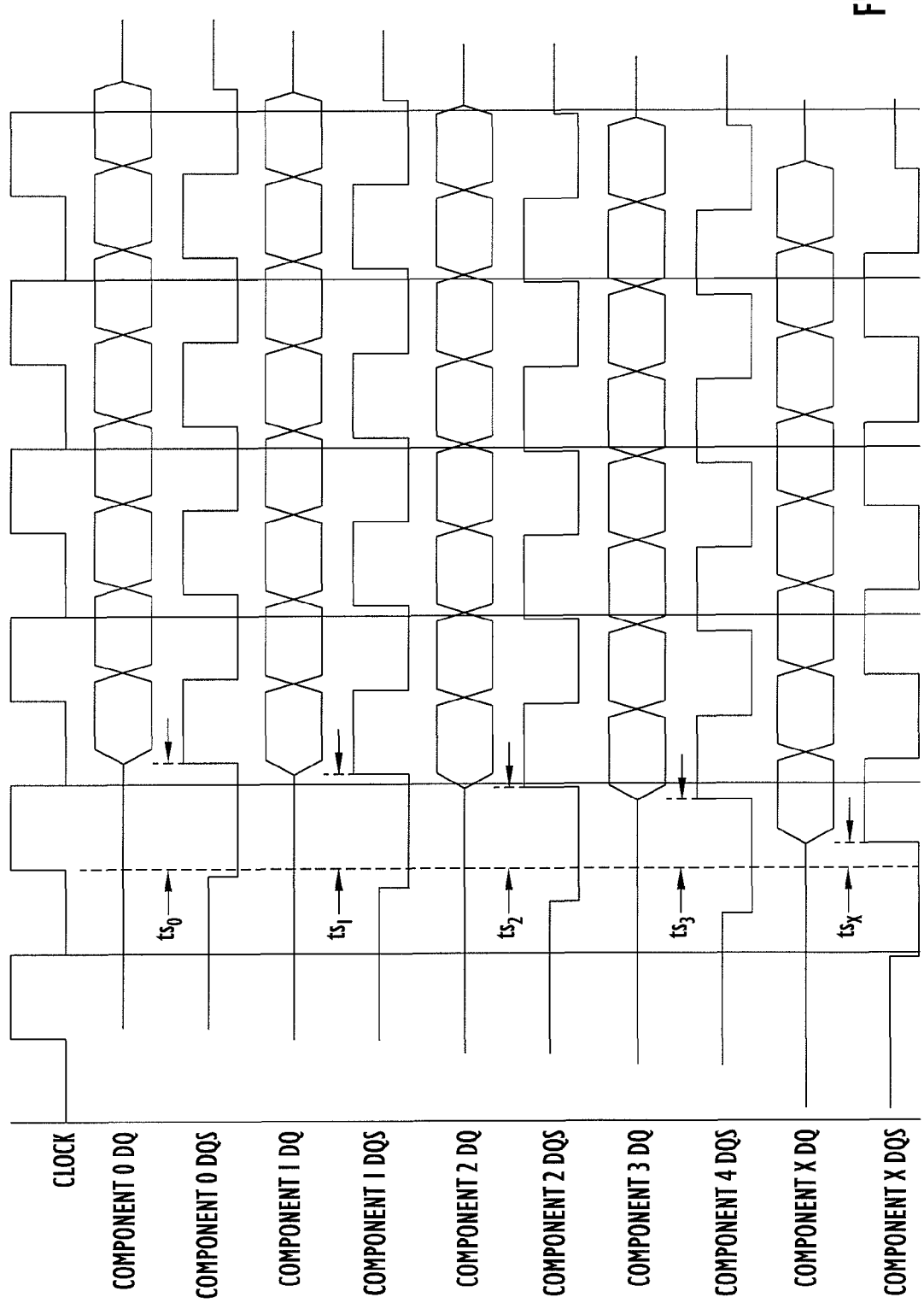
FIG. 7 is a timing diagram illustrating operation of the multi-component module and method according to an embodiment of the invention.

FIG. 7 illustrates the effects of programming the DLL circuits in a plurality of components according to one embodiment. In this embodiment, the timing skew values programmed into the respective components 120(0) to 120(x) (FIG. 4) are such that the components closer to the controller that receive commands earlier in time than are programmed with a greater timing skew or delay amount than the timing skew programmed into components further from the controller. For example, the timing skew $ts_0$ is the greatest for the closest component 120(0), timing skew $ts_1$ programmed into component 120(1) is slightly less than $ts_0$, timing skew $ts_2$ programmed into component 120(2) is slightly less than $ts_1$ and so on. The timing skew $ts_x$ programmed into the last component 120(x) that is furthest from the controller may be a very small amount or zero, for example. As a result of this programming configuration of the components, the DQ and DQS output signals for component 120(0) are delayed from the rising edge of the clock signal by a time interval equal to $ts_0$, the DQ and DQS output signals $ts_1$ for component 120(1) to are delayed from the rising edge of the clock signal by a time interval equal to $ts_1$, and so on.

Reference is now made to FIG. 8 that shows the relative timing of the outputs from the plurality of components 120(0) to 120(x) programmed as depicted in the embodiment of FIG. 7. On the left side of FIG. 8, the arrival timing of the command input to each of the components in the fly-by configuration of FIG. 4 is shown, where the inherent signal delay of the command among the components is illustrated as getting progressively larger for components further from the module controller. However, as a result of the timing skew values programmed into the components, the outputs of the components 120(0) to 120(x) are time aligned as shown on the right hand side of FIG. 8.

Since the output data from the components occurs at the same time, the design of the module controller and a tester device for the module can be simplified. The module controller can expect the output data from the components to arrive at substantially the same time (at the edge connector) rather than having to gather up the data from the components at different times. Again, the timing offset measurements and timing skew programming may be performed by a module controller or by a tester device that is used to test operation of the module. The benefit to a tester device is that only a single strobe timing resource need be allocated to analyze the output (and timing) of the component outputs.

The present invention is not limited to any implementation disclosed herein. For example, there may be techniques other than an externally programmable DLL circuit for controlling the timing skew in the components. Moreover, while the foregoing presents one embodiment in which the timing skew data programmed into the components on a module achieves synchronized (time aligned) data output from the components, there may be other uses for the techniques described herein to intentionally control the output timing of the components such that they have a predetermined timing relationship, but not necessarily time aligned to each other.

Further still, the techniques described herein are not limited to a memory module or to a fly-by configuration of components on a multi-component module. They are applicable to any type of multi-component module having multiple components of the same or different types, where it is desirable to control the timing offsets with respect to a clock signal of outputs from the components.

The system and methods described herein may be embodied in other specific forms without departing from the spirit or essential characteristics thereof. The foregoing embodiments are therefore to be considered in all respects illustrative and not meant to be limiting.

What is claimed is:

1. A method for controlling the timing of output of data from a plurality of components of a multi-component module, comprising:

supplying a command to the plurality of components on the module to provoke each of the components to output data in response said command;

measuring the timing offsets of the data output by the plurality of components;

computing values for timing skews to be programmed to one or more of the components based on the measured timing offsets; and programming one or more of the components with timing skew values to cause the one or more components to delay outputting data by a corresponding amount of time and such that all of the components output data at substantially the same time.

2. The method of claim 1, wherein programming comprises supplying a command to one or more of the components to cause a multiplexer in one or more of the components to select a delay lock loop output signal from one of a plurality of delay elements that delays the delay lock loop output signal by a different delay amount.

3. A method for controlling timing of output of data from a plurality of components on a multi-component module, wherein the components are arranged on the module to receive a control signal sequentially and thus at different times but which output data from the module at dedicated outputs for each component, the method comprising:

supplying a command to the plurality of components that provokes the components to output data;

measuring timing offsets of the data output by the plurality of components;

computing amounts for time delays to be programmed into one or more of the components based on the measured timing offsets;

programming one or more of the components to delay output of data by a time interval corresponding the computed time delay amounts such that the plurality of components output data at substantially the same time.

4. The method of claim 3, wherein said programming is performed by a controller or a tester device.

5. A multi-component electronic module device, comprising:

a plurality of components each of which is a semiconductor integrated circuit memory device, wherein one or more of the components is programmable to delay outputting data by a corresponding amount of time;

a control signal bus that connects a control signal to the plurality of components such that the components receive the control signal at different times and consequently react to the control signal at different times; and a controller that is configured to supply a control signal to the plurality of components that provokes the plurality of components to output data, wherein the controller is further configured to measure timing offsets of the data output by the plurality of components, to compute amounts for time delays to be programmed into one or more of the components based on the measured timing offsets and to supply a programming command to one or more of the components to program time delay amounts into the one or more components;

wherein each component comprises a clock processing circuit that is responsive to an externally supplied clock signal and an output of the clock processing circuit is used to control timing of output from the component, and wherein a timing skew of the output of the clock processing circuit with respect to an edge of the externally supplied clock signal is programmable by the programming command supplied by the controller so that the plurality of components output data at substantially the same time.

6. The device of claim 5, wherein each component comprises a plurality of delay elements each of which is capable of introducing a different delay amount to the output of the clock processing circuit, and wherein one of the delay elements is selected in at least one of the plurality of components in response to the programming command received from the controller.

7. In combination, a multi-component electronic module device comprising a plurality of components, wherein one or more of the components is externally programmable to delay outputting data by a corresponding amount of time, and a controller that is configured to supply a control signal to the plurality of components, wherein the controller is further configured to measure timing offsets of the data output by the plurality of components and to compute amounts for time delays to be programmed into one or more components based on the measured timing offsets to cause all the components to output data at substantially the same time.

8. The combination of claim 7, wherein said controller is a component controller device that controls operation of the plurality of components or is a tester device that tests operation of the plurality of components.

9. In combination, a multi-component electronic module device comprising a plurality of components that receive commands at different times, wherein one or more components comprise means for delaying output of data by a time interval that is programmable by a command, and means for controlling that supplies a command signal to the plurality of components that provokes the components to output data, and wherein said means for controlling receives the output data from the plurality of components, measures timing offsets of the data output by the plurality of components and computes values for a time interval to be programmed into respective ones of the one or more components to cause all the components to output data at substantially the same time.

10. The device of claim 9, wherein said means for delaying in the one or more components is programmable such that the plurality of components output data in response to a command at substantially the same time.

11. The device of claim 9, wherein said means for programming adjusts a timing skew of a signal output by a clock processing circuit with respect to a clock signal.

12. The combination of claim 7, wherein each component comprises a plurality of delay elements each of which is capable of introducing a different delay amount to the output of the clock processing circuit, and wherein one of the delay elements is selected in at least one of the plurality of components in response to a programming command received from the controller.

* * * * *